(12) United States Patent
Asano et al.

(10) Patent No.: US 6,774,192 B2
(45) Date of Patent: Aug. 10, 2004

(54) PHOTOSENSITIVE RESIN COMPOSITION, ITS USE, LACTONE-RING-CONTAINING POLYMER, AND PRODUCTION PROCESS THEREFOR

(75) Inventors: Hideo Asano, Osaka (JP); Kenichi Ueda, Suita (JP); Minoru Yamaguchi, Ibaraki (JP); Masatoshi Yoshida, Nara (JP); Tomomasa Kaneko, Kyoto (JP); Shingo Kataoka, Ibaraki (JP)

(73) Assignee: Nippon Shokubai Co., Ltd., Osaka (JP)

( * ) Notice: Subject to any disclaimer, the term of this patent is extended or adjusted under 35 U.S.C. 154(b) by 196 days.

(21) Appl. No.: 10/012,083

(22) Filed: Dec. 2, 2001

(65) Prior Publication Data

US 2002/0106568 A1 Aug. 8, 2002

(30) Foreign Application Priority Data

Dec. 5, 2000 (JP) ........................................ 2000-370661

(51) Int. Cl.$^7$ ............................ C08E 16/14; C08F 8/16; C08S 8/14; G03F 7/038; G03F 7/027
(52) U.S. Cl. ................. 525/286; 430/285.1; 430/287.1; 526/318.42
(58) Field of Search ....................... 525/286; 526/318.42

(56) References Cited

U.S. PATENT DOCUMENTS

| 4,691,045 A | 9/1987 | Fukuchi et al. | |
| 2001/0049073 A1 * | 12/2001 | Hada et al. ............... | 430/270.1 |

FOREIGN PATENT DOCUMENTS

| EP | 1 008 606 A1 | 6/2000 | |
| JP | 1-152449 A | 6/1989 | |
| JP | 6-27665 A | 2/1994 | |
| JP | 9-241323 A | 9/1997 | |
| JP | 10-324714 A | * 12/1998 | |
| JP | 11-174464 A | 7/1999 | |
| JP | 11-50001 A | * 11/1999 | ......... C09D/133/00 |
| JP | 2000-206694 A | * 7/2000 | ........... G03F/7/038 |

OTHER PUBLICATIONS

130:82044 CA, Chemical Abstracts, ACS, copyright 2003, English abstract of JP 10–224714–A2, Nagawa et al, one page.*
Derwent–ACC–No: 1999–090100, copyright 1999 Derwent Information LTD, 2 pages, English abstract of JP 10–324714A to Nippon Shokubai Co Ltd.*
Pat–No: JP410324714A, copyright 1998, JPO, one page, English abstract of JP 10–321714 A to Nakagawa et al.*
Publication No. 2000–206694, 1998, JPO, one page, English abstract of JP 2000–206694 A to Hideo et al. and Attached Machine translation generated for this patent from Searching PAJ on Japan Patent Office web site www.ipdl.jpo.go.jp.*
Publication No. 11–050001, 1998, JPO, one page, English abstract of JP 11–50001 A to Takehiko et al and Attached Machine translation generated for this patent from Searching PAJ on Japan Office web sicte www.ipdl.jpo.go.jp.*
Hada et al, "Chemically Amplified Negative–Tone Resist Using Novel Acryl Polymer for 193nm Lithography," in Microlithograph 1999: Advances in Resist Technology and Processing XVI, Will conely, Editor, Proceedings of SPIE vol. 3678, pp. 676–683.*
Publication No. 10–324714A, 1998, JPO, one page, English abstract of JP 10–321714 A to Nakagawa et al. and Attached Machine translation of Jp 10–321714 generated for this patent from Searching PAJ on Japan Patent Office web site www.ipdl.jpo.go.jp.*
130:82044 CA, Chemical Abstracts, ACS, copyright 2003, English abstract of JP 10–224714–A2, Nagawa et al, one page.*
Derwent–ACC–No: 1999–090100, copyright 1999 Derwent Information LTD, 2 pages, English abstract of JP 10–324714A to Nippon Shokubai Co LTD.*
Pat–No: JP410324714A, copyright 1998, JPO, one page, English abstract of JP 10–321714 A to Nakagawa et al.*

* cited by examiner

Primary Examiner—Cynthia Hamilton
(74) Attorney, Agent, or Firm—Haugen Law Firm PLLP

(57) ABSTRACT

The present invention provides: a photosensitive resin composition, which can form uniform coating films having higher coating film strength without causing surface contamination, decrease of evenness of coating films, decrease of film thickness, and coloring by decomposition in heat treatment of subsequent steps, and has good sensitivity of exposure. The photosensitive resin composition comprises a lactone-ring-containing polymer (A) as an essential component, wherein: the lactone-ring-containing polymer (A) is obtained by carrying out polymerization of comonomers and lactonization at the same time wherein the comonomers include a 2-(hydroxyalkyl)acrylate ester and an acidic-group-containing monomer; and the lactone-ring-containing polymer (A) is obtained by almost quantitatively carrying out lactonization of a 2-(hydroxyalkyl)acrylate ester structural unit.

5 Claims, 2 Drawing Sheets

PHOTOSENSITIVE RESIN COMPOSITION, ITS USE, LACTONE-RING-CONTAINING POLYMER, AND PRODUCTION PROCESS THEREFOR

BACKGROUND OF THE INVENTION

A. Technical Field

The present invention relates to: a useful photosensitive resin composition as a photoresist material in uses, such as color filter members, producing semiconductor circuit elements, photomasks in photolithography processes, minutely processing metals (for example, producing printed-wiring circuit boards), and protecting layers for various electronic elements (for example, intercalation insulated membranes); its use; and a production process for a lactone-ring-containing polymer included in the photosensitive resin composition; and a novel polymer that is particularly favorable as the lactone-ring-containing polymer. More particularly, the photosensitive resin composition can favorably be used as various members in color filters used for such as color liquid-crystal displays, color scanners, and video cameras, and can be applied to displays with liquid-crystal system or system using organic EL.

B. Background Art

As to photosensitive resin compositions used for a color filter, for example, JP-A-152449/1989 proposes a photosensitive resin composition for a color filter, which comprises a (meth)acrylate ester binder resin, a pigment, a dispersant, a photopolymerization initiator, and a photopolymerizable monomer. However, the heat resistance and heat stability were low in this technique. Therefore, there were problems such that: the deterioration and decomposition are caused in a subsequent heat treatment step; and the surface contamination, the decrease of evenness of coating films, the decrease of film thickness, and the coloring are caused. In addition, satisfactory properties as to coating film strength and sensitivity of exposure were also not obtained sufficiently.

In addition, JP-A-174464/1999 discloses the technique that involves taking advantage of photolithography to produce pillar spacers for displays from a photosensitive resin which is obtained by: allowing glycidyl (meth)acrylate to react with a portion of carboxyl groups of a (meth)acrylate ester polymer having the carboxyl groups; and introducing a (meth)acryloyl group. However, this technique improved the sensitivity of exposure, but the heat resistance and the coating film strength could not be said satisfactory.

In addition, JP-A-27665/1994 proposes a photosensitive resin composition for a dry film resist, which comprises: a copolymer obtained from a (meth)acrylate ester, (meth) acrylic acid, and a 2-(hydroxymethyl)acrylate ester; a photopolymerization initiator; and an ethylenically unsaturated compound. However, the development was insufficient in this technique, and the sensitivity of exposure and the coating film strength were not satisfactory, and the composition was not satisfactory as a photosensitive resin composition for a color filter.

SUMMARY OF THE INVENTION

A. Object of the Invention

Accordingly, an object of the present invention is to provide: a photosensitive resin composition, which can form uniform coating films having higher coating film strength without causing surface contamination, decrease of evenness of coating films, decrease of film thickness, and coloring by decomposition in heat treatment of subsequent steps, and has good sensitivity of exposure; use of the photosensitive resin composition; a production process for a lactone-ring-containing polymer included in the photosensitive resin composition; and a novel polymer that is particularly favorable as the lactone-ring-containing polymer.

B. Disclosure of the Invention

A photosensitive resin composition, according to the present invention, comprises a lactone-ring-containing polymer (A) as an essential component, wherein the lactone-ring-containing polymer (A) is obtained from comonomers including a 2-(hydroxyalkyl)acrylate ester and an acidic-group-containing monomer.

A color filter, according to the present invention, comprises a substrate and a resin layer, wherein the resin layer is arranged on the substrate and is formed by photocuring the photosensitive resin composition, wherein photosensitive resin composition further comprises a radically polymerizable compound and/or a photopolymerization initiator, and may further comprise a colorant and/or a dispersant.

A display, according to the present invention, comprises the color filter.

A production process for a lactone-ring-containing polymer having a lactone ring structure formed by lactonization of a structural unit derived from a 2-(hydroxyalkyl)acrylate ester, according to the present invention, comprises the step of carrying out polymerization of comonomers at 50 to 150° C., wherein the comonomers include an acidic-group-containing monomer together with the 2-(hydroxyalkyl) acrylate ester as essential monomer components.

A lactone-ring-containing polymer, according to the present invention, is obtained from comonomers including a 2-(hydroxyalkyl)acrylate ester and an acidic-group-containing monomer, and has a side chain including a radically polymerizable double bond.

These and other objects and the advantages of the present invention will be more fully apparent from the following detailed disclosure.

DETAILED DESCRIPTION OF THE INVENTION

Figure 1:
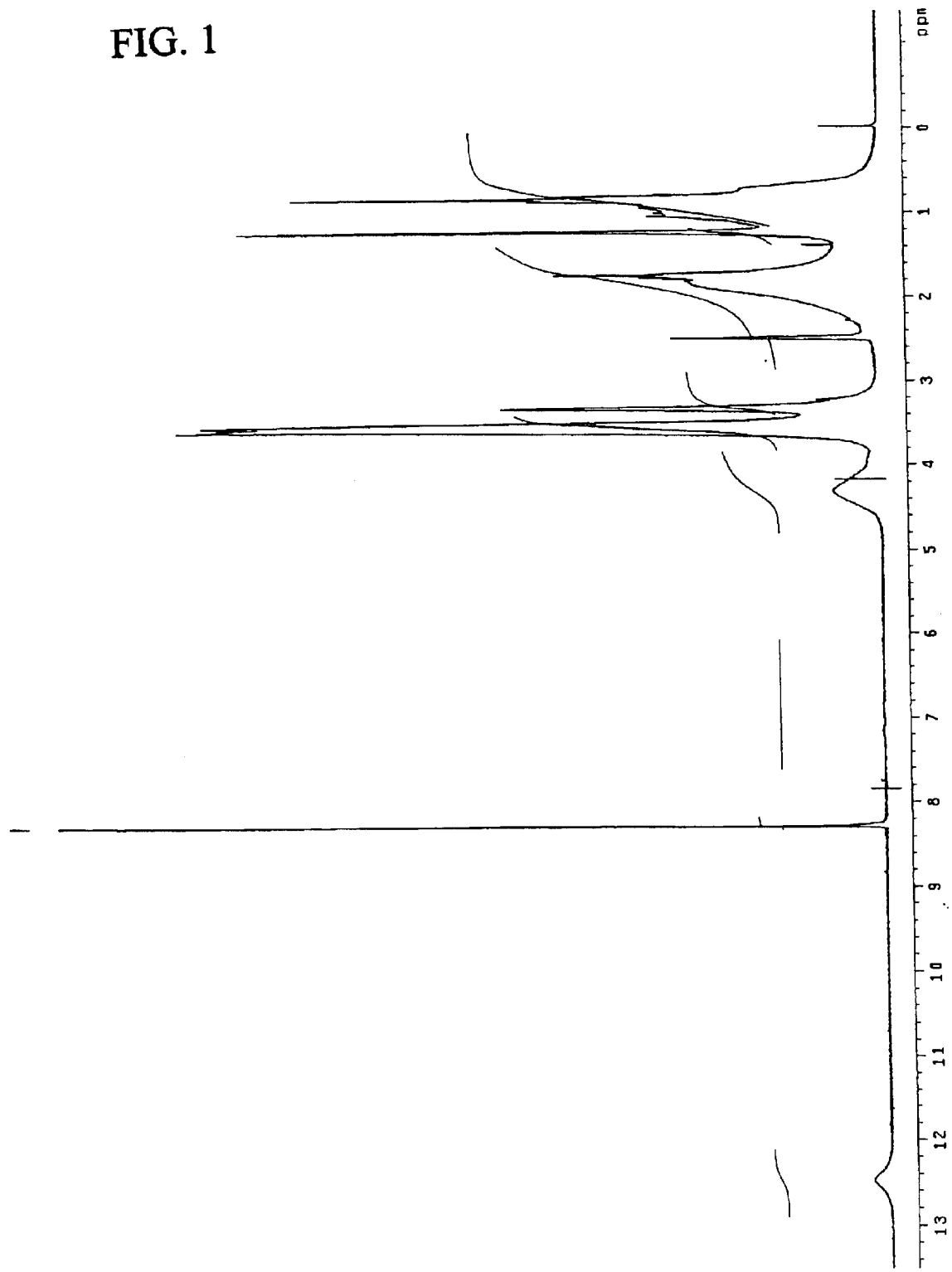
FIG. 1 is a $^1$H-NMR chart of a polymer as obtained in Example 1-6.

The photosensitive resin composition, according to the present invention, comprises a lactone-ring-containing polymer (A) as an essential component, wherein the lactone-ring-containing polymer (A) is obtained from comonomers including a 2-(hydroxyalkyl)acrylate ester and an acidic-group-containing monomer. In the present invention, the polymer (A) has a lactone ring structure formed by lactonization of a structural unit derived from the 2-(hydroxyalkyl) acrylate ester, and an acidic group derived from an acidic-group-containing monomer in its structure, and the structural unit derived from the 2-(hydroxyalkyl)acrylate ester is almost quantitatively lactonized.

In the first place, the comonomers including the 2-(hydroxyalkyl)acrylate ester and the 2-(hydroxyalkyl) acrylate ester, which are raw materials of the polymer (A), are explained.

It is favorable that the comonomers further include (meth) acrylate esters other than the 2-(hydroxyalkyl)acrylate ester and the acidic-group-containing monomer as essential components, and the comonomers may further include other copolymerizable monomers when the occasion demands.

Examples of the 2-(hydroxyalkyl)acrylate ester include a compound represented in the following formula (1).

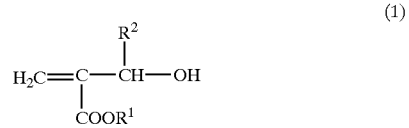

(1)

(wherein, $R^1$ and $R^2$ each independently represent a hydrogen atom or an organic residual group having 1 to 20 carbon atoms.)

Examples of the above compound include: methyl 2-(hydroxymethyl)acrylate, ethyl 2-(hydroxymethyl)acrylate, iso-propyl 2-(hydroxymethyl)acrylate, n-butyl 2-(hydroxymethyl)acrylate, tert-butyl 2-(hydroxymethyl)acrylate, and 2-ethylhexyl 2-(hydroxymethyl)acrylate. Among these, methyl 2-(hydroxymethyl)acrylate and ethyl 2-(hydroxymethyl)acrylate are favorable. These may be used either alone respectively or in combinations with each other.

The ratio of the 2-(hydroxyalkyl)acrylate ester in the comonomers is not especially limited, but may be in the range of 10 to 80 weight %, favorably 20 to 70 weight %, more favorably 30 to 60 weight %, of the entirety of the comonomers. In the case where the amount of the 2-(hydroxyalkyl)acrylate ester is too much, the solvent solubility of the resultant lactone-ring-polymer, the compatibility with other components, and the alkali solubility are decreased, and the viscosity is increased. Then, the development, transparency, and workability may be lowered. On the other hand, in the case where the amount is too little, there may be a possibility that the sufficient heat resistance and strength cannot be caused.

Examples of the acidic-group-containing monomer include: carboxyl-group-containing monomers, such as (meth)acrylic acid and itaconic acid; phosphoric-acid-group-containing monomers; sulfonic-acid-group-containing monomers; and phenol-group-containing monomers, but (meth)acrylic acid is favorable. These may be used either alone respectively or in combinations with each other.

The ratio of the acidic-group-containing monomer in the comonomers is not especially limited, but may be in the range of 5 to 70 weight %, favorably 15 to 60 weight %, of the entirety of the comonomers. In the case where the amount of the acidic-group-containing monomer is too much, the alkali solubility of the resultant lactone-ring-polymer is in excess, the solvent solubility and the compatibility with other components are decreased, and the viscosity may be increased. Then, the development, transparency, and workability may be lowered. On the other hand, in the case where the amount is too little, the development may be lowered because the alkali solubility is insufficient.

Examples of the (meth)acrylate esters include: methyl (meth)acrylate, ethyl (meth)acrylate, n-propyl (meth)acrylate, iso-propyl (meth)acrylate, n-butyl (meth)acrylate, iso-butyl (meth)acrylate, tert-butyl (meth)acrylate, 2-ethylhexyl (meth)acrylate, cyclohexyl (meth)acrylate, benzyl (meth)acrylate, and 2-hydroxyethyl (meth)acrylate. Among these, the following (meth)acrylate esters with an ester group having a small number of carbon atoms are favorable: methyl (meth)acrylate, ethyl (meth)acrylate, n-propyl (meth)acrylate, iso-propyl (meth)acrylate, n-butyl (meth)acrylate, iso-butyl (meth)acrylate, and tert-butyl (meth)acrylate. These may be used either alone respectively or in combinations with each other.

The ratio of the (meth)acrylate ester monomers in the comonomers is not especially limited, but may be in the range of 0 to 80 weight % of the entirety of the comonomers, so that the ratios of the 2-(hydroxyalkyl)acrylate ester and the acidic-group-containing monomer would be adjusted to the above favorable ratios.

Examples of the other copolymerizable monomers include: styrene, vinyltoluene, α-methylstyrene, acrylonitrile, methyl vinyl ketone, ethylene, propylene, vinyl chloride, and vinyl acetate. Among these, styrene and α-methylstyrene are particularly favorable because they can further improve the heat resistance. Incidentally, these may be used either alone respectively and in combinations with each other.

The ratio of the other copolymerizable monomers in the comonomers is not especially limited, but is favorably in the range of not more than 30 weight %.

The polymer (A), which is an essential component in the photosensitive resin composition according to the present invention, is obtained by carrying out solution polymerization of the comonomers and lactonization at the same time. The polymer is obtained by almost quantitatively carrying out lactonization of the structural unit derived from the 2-(hydroxyalkyl)acrylate ester, and examples thereof include a polymer having a lactone ring structure and an acidic group derived from the acidic-group-containing monomer as represented in the following formula (2).

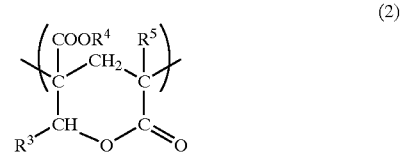

(2)

(wherein, $R^3$, $R^4$ and $R^5$ each independently represent a hydrogen atom or an organic residual group having 1 to 20 carbon atoms. Incidentally, the organic residual group may include an oxygen atom.)

The above lactonization means a reaction to form the lactone ring structure in a molecular chain of the polymer (in a main skeleton of the polymer) by cyclocondensation between a hydroxyl group and an ester group or a carboxylic group, wherein the hydroxyl group is derived from the 2-(hydroxyalkyl)acrylate ester structural unit that is formed in the molecular chain of the polymer by the solution polymerization of the comonomers, and wherein the ester group or carboxylic group is derived from a structural unit adjacent to the 2-(hydroxyalkyl)acrylate ester structural unit. The lactonization side-produces an alcohol and water. In this way, the transparency, heat resistance, and coating film strength can be improved by forming the lactone ring structure in the main skeleton of the polymer. Incidentally, the polymer (A) does not have an unlactonized structural unit derived from the 2-(hydroxyalkyl)acrylate ester at all, but all the 2-(hydroxyalkyl)acrylate ester structural units, which exist in the molecular chain as formed by the solution polymerization of the comonomers, are not lactonized. As is mentioned later, the residual hydroxyl group content may favorably be not more than 10 mol %, more favorably not more than 5 mol %.

The polymer (A) may have a functional group in its side chain. Examples of the functional group include: radically polymerizable double bond groups, such as a (meth)acryloyl group, a p-vinylphenyl group, and a (meth)ally group; and epoxy groups, such as a glycidyl group; an oxazoline group; and hydroxyl groups, such as a 2-hydroxyethyl group. The radically polymerizable double bond groups are the most favorable in view of curing by light. In addition, when the polymer has the hydroxyl group in its side chain, a kind of transesterification reaction, which is an intermolecular reaction between the lactone ring and the hydroxyl group, is caused, and therefore the crosslinking can be carried out by newly forming an intermolecular ester bond. In addition, the hydroxyl group is comparatively easily introduced into the side chain. Accordingly, the hydroxyl group is favorable in this point. Particularly, the polymer (A), which is obtained by carrying out an addition reaction of a compound such as glycidyl (meth)acrylate to an acidic group of the polymer as obtained by the polymerization of the conomomers and thereafter lactonization wherein the compound has an epoxy group and a radically polymerizable double bond group, is the most favorable because the polymer (A) has not only the radically polymerizable group but also the hydroxyl group in the side chain. In this way, the introduction of the functional group in the side chain can improve not only the development while curing but also the coating film strength and heat resistance after curing.

The production process for a lactone-ring-containing polymer, according to the present invention, comprises the step of carrying out the solution polymerization of the comonomers at 50 to 150° C. If a solvent in which the polymer (A) can sufficiently be dissolved is used in the process, the acidic-group-containing monomer or the polymer (A) acts as a catalyst in the cyclization. Therefore, the copolymerization of the comonomers and the lactonization can be carried out at the same time. The fact, that the copolymerization of the comonomers and the lactonization can be carried out at the same time, for example, can be confirmed by observing the decrease of the vinyl group absorption in the neighborhood of 6,170 cm$^{-1}$ and the increase of the lactone ring absorption in the neighborhood of 5,260 cm$^{-1}$ with an IR apparatus at the same time. In addition, if necessary, conventional transesterification catalysts or lactonization catalysts may be used. However, the polymer (A) may be extremely colored when the lactonization catalysts are used, and the coloring and cure inhibition may be caused when the polymer (A) is used for the photosensitive resin composition. Accordingly, it is favorable not to use the lactonization catalysts. If the lactonization catalysts are used, it is favorable to use tertiary amines such as triethylamine in view of the coloring.

In the production process for a lactone-ring-containing polymer, according to the present invention, it is important that the temperature is adjusted to 50 to 150° C. in the solvent polymerization and lactonization reaction with an appropriate solvent. However, if the temperature is in this range, the refluxing may be carried out at a boiling point of solvents as mentioned later.

The method for adding the comonomers in the polymerization and lactonization reaction is not especially limited, the entirety of the comonomers may be charged in one lot, or the portion may be charged in one lot and the rest may be dropwise added, or the entirety may be dropwise added. In view of controlling a heat value, it is favorable that the portion may be charged in one lot and the rest may be dropwise added, or the entirety may be dropwise added.

The solvent as used in the polymerization and lactonization reaction is not especially limited, but examples thereof include solvents as used in an ordinary radical polymerization reaction, and include: ethers, such as tetrahydrofuran, dioxane, ethylene glycol dimethyl ether, and diethylene glycol dimethyl ether; ketones, such as acetone, methyl ethyl ketone, methyl iso-butyl ketone, and cyclohexanone; esters, such as ethyl acetate, butyl acetate, propylene glycol monomethyl ether acetate, and 3-methoxybutyl acetate; alcohols, such as methanol, ethanol, iso-propanol, n-butanol, ethylene glycol monomethyl ether, and propylene glycol monomethyl ether; aromatic hydrocarbons such as toluene, xylene, and ethylbenzene; and chloroform, and DMSO. In particular, when the boiling point of the solvent as used is too higher, the residual volatile content increases in the photosensitive resin composition as obtained. Therefore, a solvent, in which the polymer (A) can be dissolved at a treating temperature, and which has a boiling point of 50 to 200° C., is favorable. Favorable examples thereof include: propylene glycol monomethyl ether acetate and 3-methoxybutyl acetate, among the esters, ketones, and ethers in view of the solubility of the polymer. In addition, it is favorable that the solvent as used in the polymerization is similar to the solvent as used in the preparation of the photosensitive resin composition. In this case, the following solvent, which has a boiling point of 100 to 200° C., more favorably 120 to 180° C., may be used: diethylene glycol dimethyl ether, cyclohexanone, propylene glycol monomethyl ether acetate, and 3-methoxybutyl acetate. These solvents may be used either alone respectively or in combinations with each other. The amount of the solvent may be adjusted to the range of 5 to 90 weight %, favorably 10 to 80 weight %, more favorably 30 to 75 weight %, of the entirety.

When the polymerization and lactonization reaction are carried out, a polymerization initiator as ordinary used may be added thereto if necessary. The polymerization initiator is not especially limited, but examples thereof include: organic peroxides, such as cumene hydroperoxide, diioproylbenzene hydroperoxide, di-t-butylperoxide, lauroyl peroxide, benzoyl peroxide, t-butylperoxy iso-propyl carbonate, t-butylperoxy-2-ethyl hexanoate, and t-amylperoxy-2-ethyl hexanoate; azo compounds, such as 2,2'-azobis(isobutyronitrile), 1,1'-azobis(cyclohexanecarbonitrile), 2,2'-azobis(2,4-dimethyl valeronitrile), and dimethyl 2,2'-azobis(2-methyl propionate). Among these, t-butylperoxy-2-ethyl hexanoate and dimethyl 2,2'-azobis(2-methyl propionate) are favorable in view of decomposition temperature, and ease of availability and handling. These may be used either alone respectively or in combinations with each other. Incidentally, the amount of the initiator as used may fitly be adjusted in accordance with the combination of the monomers as used and the reaction condition, and is not especially limited. Incidentally, the method for adding the initiator is not especially limited, the entirety of the initiator may be charged in one lot, or the portion may be charged in one lot and the rest may be dropwise added, or the entirety may be dropwise added. In addition, when the initiator is dropwise added together with the comonomers, it is favorable that the reaction is easily controlled. When the initiator is further added after dropwise adding the comonomers, the amount of the residual monomer can favorably be decreased.

When the polymerization and lactonization reaction are carried out, a chain transfer agent as ordinary used may be added thereto in order to adjust molecular weight if necessary. Examples of the chain transfer agent include: thiol chain transfer agents, such as n-dodecanethiol; and α-styrene dimmers. However, n-dodecanethiol is favorable because it has a higher effect of chain transfer, and can decrease residual monomers, and is easily available.

When the polymerization and lactonization reaction are carried out, an aging reaction is favorably carried out after adding the comonomers, polymerization initiator, and chain transfer agent if necessary.

When the polymerization and lactonization reaction are carried out, the procedure for dehydration and dealcoholation is favorably carried out after the reaction or aging. Accordingly, the lactonization ratio can further be improved, and at the same time, when the radically polymerizable double bond is introduced into the side chain, the resultant side-reaction can be inhibited. Furthermore, when the photosensitive resin composition includes water or an alcohol, the following problems may be caused: the pigment dispersibility and curability is lowered; and when color filters or displays are produced by use of the photosensitive resin composition, the color purity or brightness is lowered. However, these problems are avoided by carrying out the dehydration and dealcoholation. The method for the dehydration and dealcoholation is not especially limited, but examples thereof include: a method which involves evaporation under an ordinary or reduced pressure; a method which involves evaporation under an ordinary or reduced pressure while dry nitrogen or argon is bubbled; and a method which involves azeotropic distillation with toluene or cyclohexane under an ordinary or reduced pressure. Incidentally, the residual amount of the water and alcohol in a system after the dehydration and dealcoholation procedure may be not more than 2 weight %, favorably 0.5 weight %, most favorably 0.1 weight %, of the entirety of the reaction solution.

In the production process for a lactone-ring-containing polymer, according to the present invention, it is further favorable to carry out an addition reaction of a compound to an acidic group of the resultant polymer after the polymerization and lactonization reaction, wherein the compound has a functional group reactable with the acidic group, and a radically polymerizable double bond. Accordingly, the lactone-ring-containing polymer, which has the lactone ring structure and acidic group in the molecular chain and the radically polymerizable double bond in the side chain and has further excellent sensitivity of exposure, solvent solubility, compatibility, and strength, namely, the present invention lactone-ring-containing polymer, which is obtained from comonomers including the 2-(hydroxyalkyl) acrylate ester and the acidic-group-containing monomer and has a side chain including the radically polymerizable double bond, can be obtained.

Examples of the functional group reactable with the acidic group include a hydroxyl group, an epoxy group, and an oxazoline group. The following compounds are favorable as the compound having these groups and the radically polymerizable double bond in view of reactivity: compounds having the hydroxyl group and the double bond, such as 2-hydroxyethyl (meth)acrylate and 2-(hydroxymethyl) acrylate esters; compounds having the epoxy group and the double bond, such as glycidyl (meth)acrylate and 3,4-epoxycyclohexylmethyl (meth)acrylate; and compounds having the oxazoline group and the double bond, such as vinyl oxazoline and iso-propenyl oxazoline. Among these, glycidyl (meth)acrylate and 3,4-epoxycyclohexylmethyl (meth)acrylate are the most favorable because they have high reactivity, and their reactions are easily controlled, and they are easily available, and they can introduce not only the radically polymerizable double bond but also the hydroxyl group at the same time. The addition amount of these compounds may be in the range of 5 to 50 parts by weight, favorably 10 to 40 parts by weight, of the polymer as obtained in the above way. In the case where the amount is too little, the effect is small. In the case where the amount is too much, the gelation is easily caused when the addition reaction is carried out, and further the viscosity is increased too much and the workability is lowered. In addition, the molecular weight is increased too much, and the development is caused to deteriorate in the resultant photosensitive resin composition.

As to the reaction condition for adding the compound having the functional group reactable with the acidic group of the polymer (A), and the double bond, the temperature is favorably in the range of 50 to 150° C., more favorably 80 to 140° C., most more favorably 90 to 120° C. In the case where the temperature is lower than the above range, the addition reaction may not proceed sufficiently. In addition, in the case where the temperature is higher than the above range, the gelation is easily caused. Furthermore, when the addition reaction is carried out, the above procedure for the dehydration and dealcoholation has favorably been carried out.

Furthermore, when the addition reaction is carried out, conventional catalysts can be used if necessary. For example, when the compound to carry out addition has the epoxy group, amine compounds such as triethylamine are favorable as the catalyst. The amount of the catalyst as used is favorably in the range of 0.01 to 30 weight %, more favorably 0.05 to 5 weight %, most favorably 0.1 to 2 weight %, of the polymer. In the case where the amount of the catalyst as used is less than the above range, the addition reaction may not proceed sufficiently. In addition, in the case where the amount of the catalyst as used is more than the above range, the polymer may be colored, or may be precipitated because the catalyst content is not dissolved.

Furthermore, when the addition reaction is carried out, a gas having inhibition effect is introduced into the reaction system, or an inhibitor may be added thereto. The gelation in the addition reaction can be inhibited by introducing the gas having inhibition effect into the reaction system, or by adding the inhibitor thereto. Examples of the gas having inhibition effect include: a mixed gas including oxygen and nitrogen in a ratio of 5/95 (v/v); a mixed gas including oxygen and argon in a ratio of 5/95 (v/v); and air. The method for introducing the gas having inhibition effect and the amount as introduced are not especially limited, but may be determined in accordance with the form of the reactor, the addition reaction temperature, and the amount of the compound to carry out addition. Conventional compounds can be used as the inhibitor and are not especially limited, but examples thereof include hydroquinone, methoquinone, 2,6-di-t-butylphenol, 2,2'-methylenebis(4-methyl-6-t-butylphenol), and phenothiazine. These inhibitors may be used either alone respectively or in combinations with each other. The amount of the inhibitor as used is favorably in the range of 0.005 to 5 weight %, more favorably 0.03 to 3 weight %, most favorably 0.05 to 1.5 weight %, of the total of the polymer to be subjected to addition and the compound to carry out addition. In the case where the mount of the inhibitor is too little, the inhibition effect may not be sufficient. On the other hand, in the case where the amount of the inhibitor is too much, the sensitivity of exposure may be lowered in the photosensitive resin composition. In addition, it is more favorable that the gas and inhibitor having inhibition effect are jointly used because the amount of the inhibitor as used can be decreased and the inhibition effect can be improved.

The aforementioned polymer as obtained in the production process for a lactone-ring-containing polymer according to the present invention, especially the lactone-ring-containing polymer according to the present invention is favorable as the polymer (A) in the photosensitive resin composition according to the present invention.

In the present invention production process for obtaining the polymer (A), the lactonization ratio is not always 100 mol %, but may favorably be not less than 90 mol %, more favorably be not less than 95 mol %. The lactonization ratio is defined according to the following equation:

Lactonization ratio (mol %)=Amount of lactonized 2-(hydroxyalkyl)acrylate ester unit (mol)/total amount of 2-(hydroxyalkyl)acrylate ester (mol)×100

The lactonization ratio can concretely be calculated from the monomer unit ratio in the polymer, the residual amount of the acid monomer unit which is not lactonized in the polymer, and the generated alcohol amount or the residual hydroxyl group amount, wherein the monomer unit ratio is calculated from the amount as charged and the residual monomer amount, and wherein the residual amount of the acid monomer unit is calculated from acid value. When the lactonization ratio is calculated by use of the generated alcohol amount, the sample is obtained from the reaction solution after the reaction and aging reaction, and then the amount of the alcohol in the reaction liquid may be determined with a gas chromatography. The determined amount of the alcohol as generated is regarded as the equivalent amount of the units of the 2-(hydroxyalkyl)acrylate ester as consumed for the lactonization. When the lactonization ratio is calculated by use of the residual hydroxyl group amount, benzoic anhydride and pyridine are added to the reaction solution as sampled after the reaction and aging reaction, so that the esterification of the unreacted hydroxyl group can be carried out to obtain a benzoate ester, and thereafter the excess benzoic anhydride is hydrolyzed by adding water. After carrying out reprecipitation and purification, the resultant mixture is dried under a reduced pressure and the amount of the phenyl group is determined by measuring with $^1$H-NMR. The residual hydroxyl group amount may be calculated from the amount of the phenyl group as obtained, and the residual hydroxyl group amount is regarded as the equivalent amount of the units of the 2-(hydroxyalkyl) acrylate ester that is not lactonized.

The polymer (A) may have a lactone-ring amount in the range of favorably 0.3 to 8 mmol/g, more favorably 0.5 to 7 mmol/g, most favorably 1 to 6 mmol/g. The lactone-ring amount means an amount (mmol) of a lactone-ring per 1 g of the polymer. The lactone-ring amount, which is similar to the lactonization ratio, can be calculated from the monomer unit ratio in the polymer, the residual amount of the acid monomer unit which is not lactonized in the polymer, and the residual hydroxyl group amount. In addition, as is similar to the residual hydroxyl group amount, the lactone-ring amount can also be determined with $^1$H-NMR from the methylene peak derived from the lactone-ring.

The residual hydroxyl group content in the polymer (A) may be favorably not more than 10 mol %, more favorably not more than 5 mol %. The residual hydroxyl group content is defined according to the following equation:

Residual hydroxyl group content (mol %)=Residual amount of hydroxyl groups derived from 2-(hydroxyalkyl)acrylate ester unit per 1 g of polymer (mol)/amount of 2-(hydroxyalkyl)acrylate ester per 1 g of the entirety of the comonomers (mol)×100

The residual hydroxyl group content may concretely be calculated from the residual hydroxyl group amount measured by the following method as explained in examples in detail (a method which involves: esterifying the hydroxyl group to obtain a benzoate ester, wherein the hydroxyl group is derived from the 2-(hydroxyalkyl)acrylate ester unit which is not lactonized; and thereafter determining an amount of the phenyl group with $^1$H-NMR), and from the total amount of the comonomers.

When the content of the 2-(hydroxyalkyl)acrylate ester in the comonomers in the production of the polymer (A) is X weight %, the weight loss of the polymer (A) as measured with dynamic thermogravimetric (TG) measurement in the range of 150 to 300° C. may favorably be not more than 0.2X weight %, more favorably not more than 0.15X weight %, still more favorably not more than 0.1X weight %. In the case where the weight loss of the polymer (A) as measured with the dynamic thermogravimetric (TG) measurement in the range of 150 to 300° C. is higher than the above range, the decrease of surface evenness and film thickness, and the surface contamination are easily caused in a post-baking process after development.

When the polymer (A) does not have a side chain including a radically polymerizable double bond, the weight-average molecular weight of the polymer (A) may favorably be in the range of 3,000 to 150,000, more favorably 5,000 to 60,000, still more favorably 7,000 to 40,000. When the polymer (A) has a side chain including a functional group such as a radically polymerizable double bond, the weight-average molecular weight of the polymer before introducing the functional group may favorably be in the above range. In the case where the weight-average molecular weight is too large, the alkali solubility and the compatibility with other components are decreased, and the development and transparency of the photosensitive resin composition tend to be lowered. On the other hand, in the case where the weight-average molecular weight is too small, the alkali solubility is too strong and the curability is lowered. Therefore, the development of the photosensitive resin composition and the strength after curing the photosensitive resin composition tend to be lowered.

The glass-transition temperature (Tg) of the above polymer (A) may favorably be not lower than 115° C., more favorably not lower than 125° C., still more favorably not lower than 135° C., most favorably not lower than 140° C. Incidentally, when the polymer (A) has a side chain including a functional group such as a radically polymerizable double bond, the glass-transition temperature of the polymer before introducing the functional group may favorably be in the above range.

The photosensitive resin composition according to the present invention comprises the polymer (A) as an essential component. However, the content thereof may be favorably in the range of 1 to 70 weight %, more favorably 3 to 60 weight %, still more favorably 5 to 50 weight % in the resin composition. In the case where the content is outside of this range, there is a possibility that the coating film strength is lowered and the development is lowered.

The photosensitive resin composition according to the present invention is cured by photopolymerization reaction. Therefore, the resin composition can further comprise a radically polymerizable compound together with the polymer (A), wherein the radically polymerizable compound is necessary for the photopolymerization reaction.

Examples of the radically polymerizable compound include oligomers and monomers. Examples of the radically polymerizable oligomers include: unsaturated polyesters, epoxy acrylates, urethane acrylates, polyester acrylate, and acrylic polymers having a double bond in a side chain. Examples of the radically polymerizable monomers include: aromatic vinyl monomers, such as styrene, α-methylstyrene, α-chlorostyrene, vinyltoluene, divinyltoluene, diallyl phthalate, and diallylbenzene phosphonate; vinyl ester monomers, such as vinyl acetate and vinyl adipate; (meth) acrylic monomers, such as methyl (meth)acrylate, ethyl (meth)acrylate, butyl (meth)acrylate, β-hydroxyethyl (meth) acrylate, and (2-oxo-1,3-dioxolan-4-yl)-methyl (meth) acrylate; (meth)acrylic monomers, for example, polyfunctional (meth)acrylates, such as (di)ethylene glycol di(meth) acrylate, propylene glycol di(meth)acrylate, trimethylolpropane di(meth)acrylate, trimethylolpropane tri (meth)acrylate, pentaerythritol tetra(meth)acrylate, dipentaerythritol hexa(meth)acrylate, and tri(meth)acrylate of tris (hydroxyethyl)isocyanurate; and triallyl isocyanurate. Among these, polyfunctional (meth)acrylates are particularly favorable in consideration of photosensitive properties of the resin composition as obtained and the properties of coating films after photocuring. These radically polymerizable compounds can be used either alone respectively or in combinations with each other.

The content of the radically polymerizable compound is in the range of 5 to 500 parts by weight, favorably 20 to 300 parts by weight, more favorably 10 to 200 parts by weight, per 100 parts by weight of the polymer (A).

In addition, the photosensitive resin composition, according to the present invention, can also comprise a photopolymerization initiator necessary for photoplymerization reaction together with the polymer (A) so as to cure the composition by the photoplymerization reaction.

As to the photopolymerization initiator, conventional ones can be used. Examples thereof include: benzoin and its alkyl ethers, such as benzoin, benzoin methyl ether, and benzoin ethyl ether; acetophenones, such as acetophenone, 2,2-dimethoxy-2-phenylactophenone, and 1,1-dichloroacetophenone; anthraquinones, such as 2-methylanthraquinone, 2-amylanthraquinone, 2-t-butylanthraquinone, and 1-chloroanthraquinone; thioxanthones, such as 2,4-dimethylthioxanthone, 2,4-diisoproylthioxanthone, and 2-chlorothioxanthone; ketals, such as acetophenone dimethyl ketal and benzyl dimethyl ketal; benophenones, such as benzophenone; 2-methyl-1-[4-(methylthio)phenyl]-2-morphorino-propan-1-one and 2-benzyl-2-dimethylamino-1-(4-morphorino)butanone-1; and acyl phosphine oxides and xanthones. These photopolymerization initiators can be used either alone respectively or in combinations with each other.

The content of the photopolymerization initiator is in the range of 1 to 50 parts by weight, favorably 5 to 30 parts by weight, more favorably 5 to 20 parts by weight, per 100 parts by weight of the radically polymerizable compound that is necessary to cure the composition according to the present invention. In the case where the content of the photopolymerization initiator is too little, the photo-irradiation time must be increased, and the appropriate hardness cannot be obtained. In reverse, in the case where the photopolymerization initiator is combined more than the above range, there is no merit, and not only economical disadvantages are caused but also there is a possibility that the coating film is colored and the strength is lowered.

Furthermore, the photosensitive resin composition, according to the present invention, can further comprise a heat polymerization initiator together with the photopolymerization initiators if necessary.

As to the heat polymerization initiator, conventional ones can be used. Examples thereof include: organic peroxides, such as cumene hydroperoxide, diisoproylbenzene peroxide, di-t-butyl hydroperoxide, lauroyl peroxide, benzoyl peroxide, t-butylperoxy iso-propyl carbonate, and t-amylperoxy-2-ethyl hexanoate; and azo compounds, such as 2,2'-azobis(isobutyronitrile), 1,1'-azobis(cyclohexane carbonitrile), 2,2'-azobis(2,4-dimethyl valeronitrile), and dimethyl-2,2'-azobis(2-methyl propionate). These heat polymerization initiators can be used either alone respectively or in combinations with each other.

The photosensitive resin composition, according to the present invention, may be diluted with a diluent when the occasion demands. The radically polymerizable compound or a suitable solvent can be used as the diluent. The solvent is not especially limited, but examples thereof include: ethers, such as tetrahydrofuran, dioxane, ethylene glycol dimethyl ether, and diethylene glycol dimethyl ether; ketones, such as acetone, methyl ethyl ketone, methyl isobutyl ketone, and cyclohexanone; esters, such as ethyl acetate, butyl acetate, propylene glycol monomethyl ether acetate, and 3-methoxybutyl acetate; alcohols, such as methanol, ethanol, iso-propanol, n-butanol, ethylene glycol monomethyl ether, and propylene glycol monomethyl ether; hydrocarbons, such as toluene, xylene, and ethylbenzene; and chloroform and dimethyl sulfoxide. The amount of the diluent as used may fitly be determined according to the optimal viscosity when the resin composition is used, but the amount is favorably in the range of 5 to 500 parts by weight per 100 parts by weight of the resin composition.

The photosensitive resin composition, according to the present invention, may comprise a colorant. Conventional dyes and pigments are favorable as the colorant. Among these, pigments are more favorable. Examples thereof include: organic compounds that are classified as pigments in Color Index CI (published by the Society of Dyes and Colourists), for example, organic pigments, such as C.I. Pigment Yellow 24, C.I. Pigment Yellow 31, C.I. Pigment Yellow 53, C.I. Pigment Yellow 83, C.I. Pigment Orange 43, C.I. Pigment Red 105, C.I. Pigment Red 176, C.I. Pigment Red 177, C.I. Pigment Violet 14, C.I. Pigment Violet 29, C.I. Pigment Blue 15, C.I. Pigment Blue 22, C.I. Pigment Blue 28, C.I. Pigment Green 15, C.I. Pigment Green 25, C.I. Pigment Green 36, C.I. Pigment Brown 28, C.I. Pigment Black 1, C.I. Pigment Black 7; and inorganic pigments, such as oxides or complex oxides of metals (for example, iron, cobalt, aluminum, cadmium, lead, copper, titanium, magnesium, chrome, zinc, and antimony). These colorants may be used either alone respectively or in combinations with each other. The amount of the colorant as used is usually in the range of 0.1 to 200 parts by weight, favorably 1 to 150 parts by weight, more favorably 10 to 120 parts by weight, most favorably 30 to 110 parts by weight, per 100 parts by weight of the solid content of the photosensitive resin composition.

The photosensitive resin composition, according to the present invention, may comprise a dispersant. In particular, it is favorable to use the dispersant together with the colorant. As to the dispersant, for example, surfactants are favorable. Examples of the surfactants include: polyethylene glycol alkyl ethers, such as polyethylene glycol lauryl ether and polyethylene glycol stearyl ether; polyethylene glycol aryl ethers, such as polyethylene glycol octylphenyl ether and polyethylene glycol nonylphenyl ether; polyethylene glycol diesters, such as polyethylene glycol dilaurate and polyethylene glycol distearate; fluoride surfactants, such as BM-1000 (made by BM·Heavy); cationic surfactants, such as organosiloxane polymers; and anionic surfactants, such as anionic poly(unsaturated carboxylic acids). In addition, pigment intermediates, dye intermediates, and polymer dispersants are also favorably used. Particularly, organic pigment derivatives, which are obtained by introducing a substituent into an organic pigment as a main body, are favorable. Examples of the organic pigment as a main body include: azo pigments, phthalocyanine pigments, quinuclidone pigments, anthraquinone pigments, perylene pigments, thioindigo pigments, dioxazine pigments, and metal-complex pigments. Examples of the substituents include: a hydroxyl group, a carboxyl group, a sulfone group, a carbonamide group, and a sulfonamide group. The amount of the dispersant as used is usually in the range of 0.1 to 50 parts by weight, favorably 0.5 to 30 parts by weight, more favorably 1 to 20 parts by weight, most favorably 1 to 10 parts by weight, per 100 parts by weight of the colorant.

The photosensitive resin composition, according to the present invention, may comprise a compound having an active hydrogen group reactable with the lactone ring of the polymer (A). If necessary, the photosensitive resin composition may further comprise a catalyst that promotes a reaction between the lactone ring and the active hydrogen group. The intermolecular crosslinking can be promoted by comprising the compound having the active hydrogen group. The active hydrogen group is not especially limited, but examples thereof include a hydroxyl group that forms an ester bond by the reaction with the lactone ring, and a primary or secondary amino group that forms an amide bond by the reaction with the lactone ring. The compound having an active hydrogen group is not especially limited, but examples thereof include: low molecular polyhydric alcohols, such as ethylene glycol and glycerol; polymers having two or more hydroxyl groups per molecule, such as methyl (meth)acrylate/2-hydroxyethyl (meth)acrylate copolymers, polyethylene glycols having two or more hydroxyl groups, polypropylene glycols having two or more hydroxyl groups, and polymers obtained by carrying out a addition reaction of n-butyl glycidyl ether to a carboxyl group of methyl (meth)acrylate/(meth)acrylic acid copolymers; low molecular polyamines, such as ethylenediamine; low molecular compounds having at least one hydroxyl group and one radically polymerizable double bond per molecule, such as 2-hydroxyethyl (meth)acrylate, methyl (2-hydroxymethyl)acrylate, ethyl (2-hydroxymethyl) acrylate, trimethylolpropane di(meth)acrylate, dipentaerythritol tetra(meth)acrylate, and dipentaerythritol penta(meth) acrylate; and polymers having at least one hydroxyl group and one radically polymerizable double bond per molecule, such as polymers obtained by carrying out a addition reaction of glycidyl (meth)acrylate to a carboxyl group of methyl (meth)acrylate/(meth)acrylic acid copolymers. As to the catalyst that promotes the reaction of the lactone ring and the active hydrogen group, conventional transesterification catalysts can be used. Among them, tertiary amines are favorable in view of coloring. In this way, the rigid intermolecular bond (for example, an ester bond or an amide bond) is formed and coating films having higher strength can be obtained by comprising the compound having the active hydrogen group reactable with the lactone ring, and further, if necessary, the catalyst, which promotes the reaction between the lactone ring and the active hydrogen group.

When the occasion demands, the photosensitive resin composition, according to the present invention, may further comprise conventional additives, such as fillers (for example, aluminum hydroxide, talc, clay, and barium sulfate), dyes, pigments, defoamers, coupling agents, leveling agents, sensitizing agents, releasing agents, sliding agents, plasticizers, antioxidants, ultraviolet absorbing agents, flame retardants, polymerization inhibitors, thickeners, or dispersants. In addition, the composition may comprise: epoxy resins, such as novolac-type epoxy resins, bisphenol-type epoxy resins, alicyclic epoxy resins, and triglycidyl isocynurate; epoxy curing agents, such as dicyanodiamide, and imidazole; or dioxazoline compounds. The amount of these as added may fitly be determined within the range where the effect of the present invention is not spoiled.

The photosensitive resin composition, according to the present invention, is useful as a photoresist material in uses, such as color filter members, producing semiconductor circuit elements, photomasks in photolithography processes, minutely processing metals (for example, producing printed-wiring circuit boards), and protecting layers for various electronic elements (for example, intercalation insulated membranes), but it is particularly favorable as a color filter member. The color filter means an optical filter that is required to colorize images, and has at least minute picture elements with the three primary colors and a black matrix on a transparent substrate, wherein the black matrix divides the elements. The three primary colors generally comprise red (R), green (G), and blue (B). Examples of the color filter member include: a three-primary-colors-having (RGB) elements, resin black matrixes, protecting membranes, and pillar spacers.

The photosensitive resin composition for a color filter member comprises the radically polymerizable compound and the photopolymerization initiator together with the polymer (A). Particularly, when the composition is used for a RGB element, it further comprises pigments having the three primary colors comprising red, green, and blue, respectively. When the composition is used for a black matrix, it further comprises a black pigment. When the composition is used for a protecting membrane or a pillar spacer, it does not comprise a pigment. In addition, when the composition comprises a pigment, it may further comprise a dispersant.

The color filter, according to the present invention, comprises a substrate and a resin layer, wherein the resin layer is arranged on the substrate and is formed by photocuring the photosensitive resin composition for a color filter member. In the color filter according to the present invention, at least one of respective members comprised in the filter may be formed by photocuring the photosensitive resin composition for a color filter member. However, a preferred mode is that at least a RGB picture element, favorably all the members are formed by photocuring the photosensitive resin composition for a color filter member.

For example, the color filter is favorably produced in the following way.

1) The photosensitive resin composition comprising a pigment is applied onto a substrate (for example, made of glass, favorably glass including no alkali component) with a conventional method, such as a spin coating method or a spray coating method, and then dried to produce a coating film. As to the coating method, the spin coating method is favorably used. As to a drying condition, a method, which involves heat-drying at a temperature of a room temperature to 120° C. (favorably 60 to 100° C.) for 10 seconds to 60 minutes (favorably 30 seconds to 10 minutes) under ordinary pressure or vacuum, is favorable.

2) Then, a photomask (patterning film), which has an opening in accordance with a desired sectional shape, is put on the coating film in a contacting or non-contacting state, and irradiated with light in order to cure. In the present invention, the light means not only visible light but also radioactive rays, such as ultraviolet ray, X-ray, and electron beam, but the ultraviolet ray is the most favorable. As to a source of the ultraviolet ray, a high-pressure mercury-vapor lamp is favorably used in general.

3) After being irradiated with light, the development is carried out with a solvent, water, or an aqueous alkaline solution. Among these, the aqueous alkaline solution is favorable because it can carry out a high sensitive development with little burden to an environment. As to the alkaline component, potassium hydroxide, sodium hydroxide, and sodium hydroxide are favorable. The alkaline concentration is favorably in the range of 0.01 to 5 weight %, more favorably 0.05 to 3 weight %, most more favorably 0.1 to 1 weight %. In the case where the alkaline concentration is lower than the above range, the solubility of the photosensitive resin composition may be insufficient. On the reverse, in the case where the alkaline concentration is higher, the solubility is too higher and the development may be deteriorated. The aqueous alkaline solution may further comprise a surfactant. The coating film made of the photosensitive resin composition according to the present invention has excellent tack-free capacity even before exposure. Therefore, even if the photomask is put in a contacting state, it is possible that the photomask is easily peeled off and the reproduction of pattern is accurately carried out.

First of all, the aforementioned steps 1) to 3) are carried out by use of the photosensitive resin composition comprising the black pigment to form a resin black matrix on a substrate.

Next, the pigment in the photosensitive resin composition is replaced with the red (R), green (G), and blue (B) one in order, and the above steps 1) to 3) are repeated, and then picture elements having R, G, and B are formed to produce a RGB picture element.

Next, a member for a protecting membrane is formed in order to protect a RGB picture element that is formed on the substrate. Conventional thermosetting resins or photocurable resins can be used for a color filter protecting membrane, but the photosensitive resin composition for a color filter is favorably used in view of the strength, evenness, and low coloring of the coating film of the resultant color filter protecting membrane.

Furthermore, when the color filter is a liquid-crystal color filter, a pillar spacer is formed. The pillar spacer can be formed by applying the photosensitive resin composition onto a surface where the spacer should be formed with thickness such that the spacer has desired height after drying, and by carrying out the above steps 1) to 3).

When the color filter is produced, it is favorable that: when each member is produced, the (post-baking) curing is further carried out by heating after the development, and a residual solvent is completely removed. Hereupon, the curing means the following (1) and/or (2), namely, (1) curing the radically polymerizable double bond in the polymer (A) or the radically polymerizable compound as added together with the polymer (A) wherein the radically polymerizable double bond has not been cured by exposure, and (2) crosslinking by allowing the lactone ring of the polymer (A) to react with the active hydrogen group and forming other chemical bond than carbon—carbon covalent bond formed by curing the radically polymerizable double bond. Particularly, the photosensitive resin composition, which comprises the polymer (A) obtained by an addition reaction of a compound to an acidic group of a polymer obtained by polymerization and lactonization of the comonomers wherein the compound (for example, glycidyl (meth) acrylate) has an epoxy group and a radically polymerizable double bond, has the radically polymerizable double bond, lactone ring, and active hydrogen group entirely. Therefore, it is the most favorable because a very rigid crosslinked polymer is formed by carrying out the post baking. The curing temperature is favorably in the range of 120 to 300° C., more favorably 150 to 250° C., most favorably 180 to 230° C. In the case where the post-baking temperature is higher than the above range, there is a possibility that the picture element is colored or the evenness of the coating film is damaged by thermal decomposition. In reverse, in the case where the post-baking temperature is lower, there is a possibility that the curing proceeds little, and the coating film strength is lowered. The post-baking may be carried out after the development for forming each member or after forming all the members.

The display, according to the present invention, comprises the above color filter. Examples thereof include a liquid-crystal display, but the display is not especially limited thereto. For example, the display may be a display having organic EL. Hereinafter, the liquid-crystal display is explained.

The liquid-crystal display comprises a liquid-crystal display panel, wherein a colored display is actualized by: maintaining the constant interval between a color filter substrate and a counter substrate with a liquid-crystal spacer wherein the color filter substrate is equipped with the color filter, and if necessary, an ITO electrode and an orienting membrane, and wherein the counter substrate is if necessary equipped with an orienting membrane, an ITO electrode and a driving element; sealing a liquid-crystal substance in the interval; changing the orientation of the liquid crystal by electric signal; and arbitrarily changing transmittance of light. Conventional moving modes or driving systems for the liquid crystal can be used, but TFT system is favorable among them in view of display quality and response speed.

As to the liquid-crystal spacer, conventional particle spacers and pillar spacers made of a photosensitive resin can be used. Among them, a pillar spacer, which is formed by use of the present invention photosensitive resin composition for a color filter member, is favorable.

The color filter substrate and the counter substrate is equipped with an orienting membrane having the orientation according to the moving mode and the driving system for each liquid crystal, and further, if necessary, a projection (a rib), but is favorably equipped with a polyimide orienting plate. In addition, the rib may be made of not only polyimide but also the present invention photosensitive resin composition for a color filter member. Furthermore, outside of the color filter substrate and the counter substrate, it is necessary to arrange a polarizing plate and an optical compensating film according to the moving mode and the driving system for each liquid crystal.

(Effects and Advantages of the Invention)

The present invention can provide: a photosensitive resin composition, which can form uniform coating films having higher coating film strength without causing surface contamination, decrease of evenness of coating films, decrease of film thickness, and coloring by decomposition in heat treatment of subsequent steps, and has good sensitivity of exposure; and a color filter and a display obtained by using the photosensitive resin composition. The present invention can further provide: a production process for a lactone-ring-containing polymer included in the photosensitive resin composition; and a novel polymer that is particularly favorable as the lactone-ring-containing polymer.

DETAILED DESCRIPTION OF THE PREFERRED EMBODIMENTS

The respective examples of the present invention are illustrated as examples and comparative examples in the following way. Hereinafter, the present invention is more specifically illustrated by the following examples and comparative examples. However, the present invention is not limited thereto. Incidentally, in the respective examples and comparative examples, the units "part(s)" and "%" denote those by weight.

EXAMPLE 1-1

A separable flask equipped with a cooling tube was prepared as a reactor, and was charged with 426 g of diethylene glycol dimethyl ether (DMDG). After the atmosphere in the reactor was replaced with nitrogen, the reactor was heated on an oil bath to 90° C.

On the other hand, a monomer-dropping tank was prepared by: charging a beaker with 60 g of ethyl 2-(hydroxymethyl)acrylate (EHMA), 66 g of methacrylic acid (MAA), 174 g of methyl methacrylate (MMA), and 3 g of t-butylperoxy-2-ethyl hexanoate (PBO, Perbutyl O, made by Nippon Yushi); and sufficiently stirring to blend them. A chain-transfer-agent-dropping tank was prepared by: charging a beaker with 6 g of n-dodecanethiol (n-DM) and 24 g of diethylene glycol dimethyl ether (DMDG); and sufficiently stirring to blend them.

After the temperature of the reactor was stabilized at 90° C., the dropping procedure was initiated by dropping from the monomer-dropping tank and chain-transfer-agent-dropping tank respectively, and then the polymerization was initiated. The dropping procedure was carried out over a period of 180 minutes respectively while the temperature was maintained at 90° C. When 60 minutes passed after completing the dropping procedure, 0.3 g of PBO was added thereto as a booster. Since then, 0.3 g of PBO was added every 60 minutes (5 times in total, 1.5 g). In the meanwhile, the temperature of the reactor was maintained at 90° C. When 60 minutes passed after adding the last PBO, the resultant reaction mixture was sampled, and the residual monomer amount in the system was measured with a gas chromatography.

Next, a distillation equipment and a nitrogen gas introducing tube were attached to the reactor. Thereafter, 50 g of toluene as an azeotropic solvent was added thereto, and the bubbling of the nitrogen gas and the heating were initiated. The oil bath was heated to 150° C. while water and an alcohol were evaporated out of the system. When the distillate gradually decreased, the resultant reaction mixture was sampled and the residual water content was measured with a Karl-Fischer automatic water content measurement apparatus. After the water content of the system was confirmed to be not more than 1,000 ppm, the reactor was cooled to a room temperature, thus obtaining a polymer solution including a lactone-ring-containing polymer.

EXAMPLES 1-2 to 1-6

Polymer solutions were obtained in the same way as of Example 1-1 except that the amount of EHMA, MAA, MMA, and PBO in the monomer-dropping tank, the amount of n-DM and DMDG in the chain-transfer-agent-dropping tank, the kind and amount of the azeotropic solvent were changed to those as shown in Table 1. Incidentally, methyl 2-(hydroxymethyl)acrylate was used in stead of EHMA in the monomer-dropping tank of Example 1-6.

Furthermore, the reprecipitation and purification of the polymer solution as obtained in Example 1-6 was carried in hexane/toluene (volume ratio: 1/1), and the resultant precipitate was dried. Thereafter, the resultant dried precipitate was measured with $^1$H-NMR, and then a methylene peak derived from the lactone ring was confirmed. The NMR chart as obtained then was shown in FIG. 1.

EXAMPLE 1-7

A polymer solution including a lactone-ring-containing polymer was obtained in the same way as of Example 1-2 except that the procedure of dehydration and dealcoholation (namely, a procedure that involves: attaching a distillation equipment and a nitrogen gas introducing tube to the reactor; adding an azeotropic solvent thereto; initiating the bubbling of the nitrogen gas and the heating of the oil bath; and evaporating water and an alcohol out of the system) was not carried out. Then, when the residual water content was measured with a Karl-Fischer automatic water content measurement apparatus, the residual water content was 1.2 weight %.

EXAMPLE 1-8

A separable flask equipped with a cooling tube was prepared as a reactor, and was charged with 426 g of diethylene glycol dimethyl ether (DMDG). After the atmosphere in the reactor was replaced with nitrogen, the reactor was heated on an oil bath to 90° C.

On the other hand, a monomer-dropping tank was prepared by: charging a beaker with 120 g of ethyl 2-(hydroxymethyl)acrylate (EHMA), 126 g of methacrylic acid (MAA), 54 g of methyl methacrylate (MMA), and 3 g of t-butylperoxy-2-ethyl hexanoate (PBO, Perbutyl O, made by Nippon Yushi); and sufficiently stirring to blend them. A chain-transfer-agent-dropping tank was prepared by: charging a beaker with 6 g of n-dodecanethiol (n-DM) and 24 g of diethylene glycol dimethyl ether (DMDG); and sufficiently stirring to blend them.

After the temperature of the reactor was stabilized at 90° C., the dropping procedure was initiated by dropping from the monomer-dropping tank and chain-transfer-agent-dropping tank respectively, and then the polymerization was initiated. The dropping procedure was carried out over a period of 180 minutes respectively while the temperature was maintained at 90° C. When 60 minutes passed after completing the dropping procedure, 0.3 g of PBO was added thereto as a booster. Since then, 0.3 g of PBO was added every 60 minutes (5 times in total, 1.5 g). In the meanwhile, the temperature of the reactor was maintained at 90° C. When 60 minutes passed after adding the last PBO, the resultant reaction mixture was sampled, and the residual monomer amount in the system was measured with a gas chromatography.

Next, a distillation equipment and a nitrogen gas introducing tube were attached to the reactor. Thereafter, the bubbling of the nitrogen gas and the heating of the oil bath

TABLE 1

| | | Example 1-1 | Example 1-2 | Example 1-3 | Example 1-4 | Example 1-5 | Example 1-6 | Example 1-7 |
|---|---|---|---|---|---|---|---|---|
| Content of monomer-dropping tank (g) | EHMA | 60 | 120 | 180 | 60 | 60 | 90* | 120 |
| | MAA | 66 | 81 | 105 | 66 | 66 | 60 | 81 |
| | MMA | 174 | 99 | 15 | 174 | 174 | 150 | 99 |
| | PBO | 3 | 3 | 3 | 1.5 | 1.5 | 6 | 3 |
| Content of chain-transfer-agent dropping tank (g) | n-DM | 6 | 6 | 6 | 2 | 0 | 3 | 6 |
| | DMDG | 24 | 24 | 24 | 24 | 24 | 24 | 24 |
| Procedure of dehydration and Dealcoholation | | Carried out | Carried out | Carried out | Carried out | Carried out | Carried out | Not carried out |
| Azeotropic solvent (g) | | Toluene 50 | Methyl ethyl ketone 100 | Cyclohexane 50 | Not used | Not used | Not used | Not used |

*Methyl 2-(hydoxymethyl)acrylate (MHMA) was used in stead of EHMA in Example 1–6.

were initiated. The oil bath was heated to 150° C. while water and an alcohol were evaporated out of the system. When the distillate gradually decreased, the resultant reaction mixture was sampled and the residual water content was measured with a Karl-Fischer automatic water content measurement apparatus. After the water content of the system was confirmed to be not more than 1,000 ppm, the reactor was cooled to 110° C.

After the temperature of the reactor reached 110° C., the nitrogen gas as a bubbling gas was replaced with a mixed gas of oxygen/nitrogen (ratio: 5/95), and 0.5 g of 2,2'-methylenebis(4-methyl-6-t-butylphenol) (MBMTB, Antage W-400, made by Kawaguchi Chemical Co., Ltd.) as an inhibitor and 1.1 g of triethylamine (TEA) as an addition catalyst were added thereto. After being sufficiently stirred, 44 g of glycidyl methacrylate (GMA) as an addition monomer was added thereto and the addition reaction was initiated. The reaction was continued while the temperature was maintained at 110° C. When 8 hours passed after adding GMA, the resultant reaction mixture was sampled, and the residual GMA amount was measured with a gas chromatography. Since then, the sampling was carried out every hour. After the residual GMA amount was confirmed to be not more than 0.6 weight %, the reactor was cooled to a room temperature, thus obtaining a polymer solution including a lactone-ring-containing polymer that has a side chain including a radically polymerizable double bond.

When the polymer solution as obtained was analyzed according to methods as described later, the weight-average molecular weight, the acid value, and the radically polymerizable double bond amount were 28,100,111 mg KOH/g, and 0.87 mmol/g, respectively.

Figure 2:
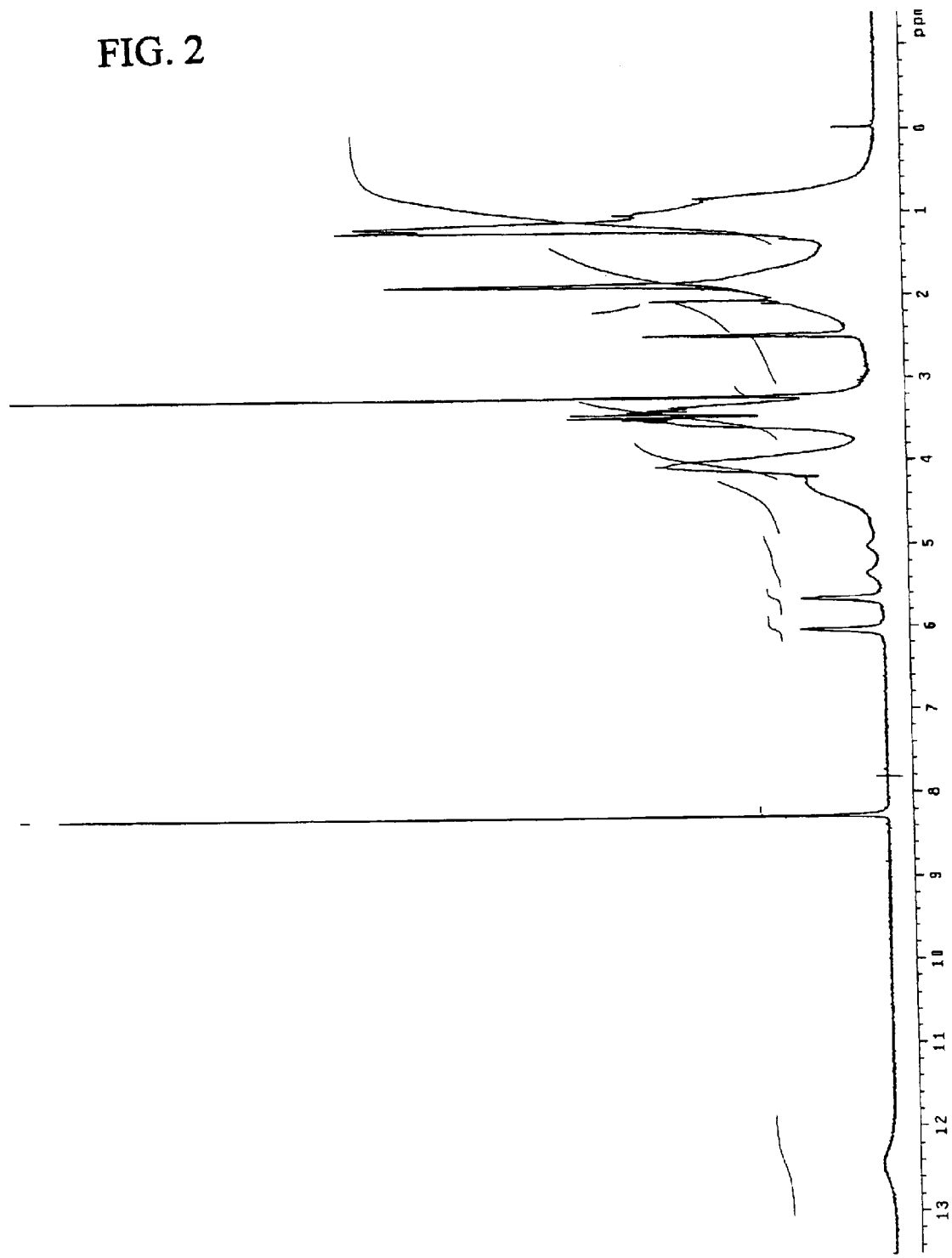
FIG. 2 is a $^1$H-NMR chart of a polymer as obtained in Example 1-8.

Furthermore, the polymer solution as obtained in Example 1-8 was measured with $^1$H-NMR, it was confirmed that a double bond (C=C) was introduced. The NMR chart as obtained then was shown in FIG. 2.

EXAMPLE 1-9

A separable flask equipped with a cooling tube was prepared as a reactor, and was charged with 423 g of diethylene glycol dimethyl ether (DMDG). After the atmosphere in the reactor was replaced with nitrogen, the reactor was heated on an oil bath to 90° C.

On the other hand, a monomer-dropping tank was prepared by: charging a beaker with 120 g of ethyl 2-(hydroxymethyl)acrylate (EHMA), 180 g of methacrylic acid (MAA), and 6 g of t-butylperoxy-2-ethyl hexanoate (PBO, Perbutyl O, made by Nippon Yushi); and sufficiently stirring to blend them. A chain-transfer-agent-dropping tank was prepared by: charging a beaker with 3 g of n-dodecanethiol (n-DM) and 27 g of diethylene glycol dimethyl ether (DMDG); and sufficiently stirring to blend them.

After the temperature of the reactor was stabilized at 90° C., the dropping procedure was initiated by dropping from the monomer-dropping tank and chain-transfer-agent-dropping tank respectively, and then the polymerization was initiated. The dropping procedure was carried out over a period of 180 minutes respectively while the temperature was maintained at 90° C. When 60 minutes passed after completing the dropping procedure, 0.3 g of PBO was added thereto as a booster. Since then, 0.3 g of PBO was added every 60 minutes (5 times in total, 1.5 g). In the meanwhile, the temperature of the reactor was maintained at 90° C. When 60 minutes passed after adding the last PBO, the resultant reaction mixture was sampled, and the residual monomer amount in the system was measured with a gas chromatography.

Next, a distillation equipment and a nitrogen gas introducing tube were attached to the reactor. Thereafter, the bubbling of the nitrogen gas and the heating of the oil bath were initiated. The oil bath was heated to 150° C. while water and an alcohol were evaporated out of the system. When the distillate gradually decreased, the resultant reaction mixture was sampled and the residual water content was measured with a Karl-Fischer automatic water content measurement apparatus. After the water content of the system was confirmed to be not more than 1,000 ppm, the reactor was cooled to 110° C.

After the temperature of the reactor reached 110° C., the nitrogen gas as a bubbling gas was replaced with a mixed gas of oxygen/nitrogen (ratio: 5/95), and 0.6 g of 2,2'-methylenebis(4-methyl-6-t-butylphenol) (MBMTB, Antage W-400, made by Kawaguchi Chemical Co., Ltd.) as an inhibitor, 1.2 g of triethylamine (TEA) as an addition catalyst, and 150 g of diethylene glycol dimethyl ether (DMDG) as a diluent were added thereto. After being sufficiently stirred, 101 g of glycidyl methacrylate (GMA) as an addition monomer was added thereto and the addition reaction was initiated. The reaction was continued while the temperature was maintained at 110° C. When 8 hours passed after adding GMA, the resultant reaction mixture was sampled, and the residual GMA amount was measured with a gas chromatography. Since then, the sampling was carried out every hour. After the residual GMA amount was confirmed to be not more than 0.6 weight %, the reactor was cooled to a room temperature, thus obtaining a polymer solution including a lactone-ring-containing polymer that had a side chain including a radically polymerizable double bond.

When the polymer solution as obtained was analyzed according to methods as described later, the weight-average molecular weight, the acid value, and the radically polymerizable double bond amount were 22,300,122 mg KOH/g, and 1.74 mmol/g, respectively.

EXAMPLE 1-10

A polymer solution, which included a lactone-ring-containing polymer that had a side chain including a radically polymerizable double bond, was obtained in the same way as of Example 1-8 except that the procedure of dehydration and dealcoholation (namely, a procedure that involves: attaching a distillation equipment and a nitrogen gas introducing tube to the reactor; adding an azeotropic solvent thereto; initiating the bubbling of the nitrogen gas and the heating of the oil bath; and evaporating water and an alcohol out of the system) was not carried out.

When the polymer solution as obtained was analyzed according to methods as described later, the weight-average molecular weight, the acid value, and the radically polymerizable double bond amount were 17,900,150 mg KOH/g, and 0.59 mmol/g, respectively. It was suggested that the side-reaction was caused by not carrying out the procedure of dehydration and dealcoholation.

Comparative Example 1-1

A polymer solution was obtained in the same way as of Example 1-1 except that the monomer-dropping tank was charged with a well-stirred mixture of 90 g of benzyl methacrylate (BzMA), 54 g of methacrylic acid (MAA), 156 g of methyl methacrylate (MMA), and 3 g of t-butylperoxy-2-ethyl hexanoate (PBO, Perbutyl O, made by Nippon Yushi), and further the azeotropic solvent was not used.

Incidentally, each analysis of the polymer solutions as obtained in Examples 1-1 to 1-7 and Comparative Example 1-1 and the reaction solutions before the addition reaction for introducing a radically polymerizable double bond in Examples 1-8 to 1-10 was carried out in the following way. The results were listed in Tables 2 and 3.

(Weight-Average Molecular Weight:)

The molecular weight was measured with Shodex GPC System-21H (produced by Showa Denko Co., Ltd.) in terms of polystyrene.

(Acid Value:)

First of all, 80 ml of acetone and 10 ml of water were added to 1.5 to 1 g of a polymer solution, and they were stirred to uniformly dissolve. The resultant solution was titrated with an aqueous potassium hydroxide solution of 0.1 mol/L as a titrant solution by use of an automatic titrator (COM-555, produced by Hiranuma Sangyo Co., Ltd.) in order to measure an acid value of the solution.

On the other hand, a solution, which was obtained by adding 2 ml of acetone to 0.3 g of the polymer solution and then dissolving them, was spontaneously dried under an ordinary temperature, and further dried under a reduced pressure (140° C./5 mmHg) for three hours. Thereafter, the resultant residue was left in a desiccator to cool, and was weighed. Thereafter, the procedure, which involved spontaneous drying, drying under a reduced pressure, and weighing, was repeated in the same way as shown above until the weight of the resultant residue was constant. Then, the non-volatile content of the polymer solution was calculated from the weight loss.

Then, the acid value of the polymer was calculated from the acid value for the polymer and the non-volatile content of the solution.

(Glass-Transition Temperature (Tg):)

The polymer (A) solution as obtained was once dissolved in tetrahydrofuran, and the resultant mixture was added to an excess solution of hexane/toluene (volume ratio: 1/1) in order to carry out reprecipitation. The resultant precipitate as isolated by filtration was dried under a reduced pressure (70° C./5 mmHg, not shorter than three hours) in order to remove volatile content. The resin as obtained was measured with a DSC apparatus (DSC8230, produced by Rigaku Co., Ltd.).

(Residual Monomer Amount:)

The residual monomer amount was determined with a gas chromatography apparatus (GC-14A, produced by Shimadzu Co., Ltd.) according to calibration curve of each monomer.

(Residual Hydroxyl Group Amount:)

First of all, the residual hydroxyl group was esterified with benzoic anhydride and further purified in the following way. That is to say, 2.5 g of a polymer solution, 1.5 g of benzoic anhydride, and 5.0 g of pyridine were weighed out in a flask, and the resultant mixture was stirred to uniformly dissolve them. Thereafter, the flask was soaked in an oil bath of which temperature was adjusted to 100° C., and the mixture was stirred for one hour. Next, 1.0 g of distilled water was added thereto, and further the resultant mixture was stirred for one hour. Thereafter, the flask was removed from the oil bath, and the reprecipitation was carried out in hexane/toluene (volume ratio: 1/1) as a reprecipitation solution. Then, the powder as obtained was dried under a reduced pressure (70° C./5 mmHg) for three hours.

Then, 200 mg of the sample as obtained in the above way, 30 to 40 mg of chloroform as an internal standard, and about 3 g of dimethyl sulfoxide-d6 were weighed out in a screw tube, and they were shaken to dissolve well. Then, the $^1$H-NMR measurement was carried out with a NMR apparatus (GEMINI2000, produced by Varian Co., Ltd.). The phenyl group amount was calculated from: an integral ratio of a phenyl group peak ($\delta$7.4 to 8.2, 5H) and a chloroform peak ($\delta$8.3, 1H) in the resultant NMR chart; the weight of the polymer, and the weight of the chloroform. Then, the residual hydroxyl group amount (mmol/g) was calculated from the phenyl group amount.

(Residual Hydroxyl Group Content:)

The residual hydroxyl group content was calculated from the residual hydroxyl group amount as measured in the above method according to the following equation:

Residual hydroxyl group content [mol %]=Residual hydroxyl group amount [mmol/g]/(Charged amount of 2-(hydroxyalkyl)acrylate ester [mmol]/Charged amount of total monomers [g])×100

(Lactone-Ring Amount:)

(1) Calculation from residual hydroxyl group amount

The molar ratio of the monomer as polymerized (monomer unit ratio in the polymer) was calculated from the residual monomer amount as measured in the above method and the charged monomer amount, and the residual amount of the acid monomer unit not lactonized in the polymer was calculated from the acid value of the polymer as measured in the above way. Then, the lactone-ring amount per 1 g of polymer (mmol/g) was determined by calculating the amount of the lactonized 2-(hydroxyalkyl)acrylate ester unit from the following three amounts: the residual hydroxyl group amount per 1 g of polymer as measured in the above method; the molar ratio of the monomer as polymerized; and the residual amount of the acid monomer unit not lactonized in the polymer. The amount of the units of the 2-(hydroxyalkyl)acrylate ester as lactonized is equal to the lactone-ring amount.

(2) Direct Determination with NMR

The reprecipitation and purification of the polymer solution was carried out in a reprecipitation solution comprising hexane/toluene (volume ratio: 1/1), and the resultant powder was dried under a reduced pressure (70° C./5 mmHg) for three hours.

Then, 200 mg of the sample as obtained in the above way, 30 to 40 mg of chloroform as an internal standard, and about 3 g of dimethyl sulfoxide-d6 were weighed out in a screw tube, and they were shaken to dissolve well. Then, the $^1$H-NMR measurement was carried out with a NMR apparatus (GEMINI2000, produced by Varian Co., Ltd.). The lactone-ring amount per 1 g of polymer (mmol/g) was calculated from: an integral ratio of a lactone-ring methylene ($\delta$3.8 to 4.8, 2H) and a chloroform peak ($\delta$8.3, 1H) in the resultant NMR chart; the weight of the polymer; and the weight of the chloroform.

(Lactonization Ratio:)

(1) Calculation from Residual Hydroxyl Group Amount

The lactonization ratio (mol %) was calculated from the amount of the lactonized 2-(hydroxyalkyl)acrylate ester unit as calculated in the above way.

(2) Calculation from Generated Alcohol Amount

The sample as used for measuring the residual monomer amount was measured with a similar gas chromatography apparatus, and the generated alcohol amount was determined according to calibration curves of methanol and ethanol. Then, the lactonization ratio (mol %) was calculated from the generated alcohol amount. The generated alcohol amount was equal to the amount of the units of the 2-(hydroxyalkyl)acrylate ester as consumed for the lactonization.

(Radically Polymerizable Double Bond (C=C) Amount:)

First of all, 1.5 g of the polymer solution was weighed out, and 2 ml of acetone was added thereto to solve. The resultant mixture was spontaneously dried under an ordinary temperature, and further the procedure, which involves drying under a reduced pressure (70° C./5 mmHg) for one hour, was repeated three times in order to remove a solvent form the polymer solution.

Then, 200 mg of the sample as obtained in the above way, 30 to 40 mg of chloroform as an internal standard, and about 3 g of dimethyl sulfoxide-d6 were weighed out in a screw tube, and they were shaken to dissolve well. Then, the $^1$H-NMR measurement was carried out with a NMR apparatus (GEMINJ2000, produced by Varian Co., Ltd.). The radically polymerizable double bond amount per 1 g of polymer (mmol/g) was calculated from: an integral ratio of a C=C peak ($\delta$5.6 to 6.2, 2H) and a chloroform peak ($\delta$8.3, 1H) in the resultant NMR chart; the weight of the polymer; and the weight of the chloroform.

(Dynamic Thermogravimetric (TG) Measurement:)

The volatile content of the polymer (A) as obtained was removed by once dissolving with tetrahydrofuran, reprecipitating by adding the resultant solution to hexane/toluene (volume ratio: 1/1), and drying the resultant precipitate as isolated by filtration under a reduced pressure (70° C./5 mmHg, and not shorter than 3 hours), and the resultant resin was analyzed under the following condition.

Measurement apparatus: Thermo Plus2 TG-8120 Dynamic TG (made by Rigaku Co., Ltd.)

Measurement condition:

| | |
|---|---|
| Sample amount/ | 5 to 10 mg |
| Rate of elevating temperature/ | 10° C./min |
| Atmosphere/ | Nitrogen flow 200 ml/min |
| Method/ | Method for controlling temperature stepwise |

(The rate for weight loss is controlled to not more than 0.005 %/sec between 60 to 500° C.).

TABLE 2

| Analytical items | | Example 1-1 | Example 1-2 | Example 1-3 | Example 1-4 | Example 1-5 | Example 1-6 | Example 1-7 |
|---|---|---|---|---|---|---|---|---|
| Weight-average molecular weight | | 13,800 | 12,900 | 11,200 | 39500 | 78,000 | 14,500 | 13,000 |
| Acid value (mgKOH/g) | | 124 | 111 | 106 | 124 | 126 | 94 | 111 |
| Tg (° C.) | | 139 | 149 | 159 | 141 | 141 | 156 | 148 |
| Dynamic TG weight loss (%) | | 4.5 | 3.1 | 1.9 | 3.3 | 2.9 | 2.7 | 3.2 |
| Residual monomer in polymerization liquid (wt %) | RHMA* | 0.50 | 0.42 | 0.40 | 0.48 | 0.41 | 0.36 | 0.40 |
| | MAA | n.d. | n.d. | n.d. | n.d. | n.d. | n.d. | n.d. |
| | MMA | 0.42 | 0.18 | n.d. | 0.29 | 0.19 | 0.22 | 0.19 |
| | BzMA | — | — | — | — | — | — | — |
| Lactonization ratio (mol %) | Calculation from residual hydroxyl group amount | 99 | 98 | 98 | 99 | 98 | 98 | 98 |
| | Calculation from generated alcohol amount | 98 | 91 | 90 | 98 | 98 | 94 | 92 |
| Residual hydroxyl group content (mol %) | | 1 | 2 | 2 | 1 | 2 | 2 | 2 |
| Residual hydroxyl group amount (mmol/g) | | 0.02 | 0.06 | 0.11 | 0.02 | 0.03 | 0.04 | 0.06 |
| Lactone-ring amount | Calculation from residual Hydroxyl group amount | 1.5 | 3.3 | 5.2 | 1.5 | 1.5 | 2.7 | 3.3 |
| | Direct determination with NMR | — | — | — | — | — | 2.3 | — |

*RHMA means EHMA and MHMA in a raw material.

TABLE 3

| Analytical items | Example 1-8** | Example 1-9** | Example 1-10** | Comparative Example 1-1 |
|---|---|---|---|---|
| Weight-average molecular weight | 14,400 | 14,000 | 14,200 | 19,000 |
| Acid value (mgKOH/g) | 174 | 265 | 172 | 115 |
| Tg (° C.) | 167 | 178 | 166 | Not measured |
| Dynamic TG weight loss (%) | 2.1 | 1.3 | 2.2 | Not measured |
| Residual monomer in polymerization liquid (wt %) | | | | |
| RHMA * | 0.44 | 0.34 | 0.41 | — |
| MAA | n.d. | n.d. | n.d. | n.d. |
| MMA | 0.14 | n.d. | 0.12 | 0.11 |
| BzMA | — | — | — | 0.31 |

TABLE 3-continued

| Analytical items | Example 1–8** | Example 1–9** | Example 1–10** | Comparative Example 1-1 |
|---|---|---|---|---|
| Lactonization ratio (mol %) | | | | |
| Calculation from residual hydroxyl group amount | 99 | 98 | 97 | — |
| Calculation from generated alcohol amount | 97 | 98 | 96 | — |
| Residual hydroxyl group content (mol %) | 2 | 2 | 2 | — |
| Residual hydroxyl group amount (mmol/g) | 0.05 | 0.09 | 0.05 | — |
| Lactone-ring Amount | | | | |
| Calculation from residual hydroxyl group amount | 3.2 | 1.5 | 3.2 | — |
| Direct determination with NMR | — | — | — | — |

*RHMA means EHMA and MHMA in a raw material.
**Properties of reaction liquids before addition reation were listed in Examples 8 to 10.

EXAMPLES 2-1 to 2-10

Comparative Example 2-1

Polymer solutions as obtained in Examples 1-1 to 1-10 and Comparative Example 1-1 were used respectively. Then, a photosensitive resin composition was obtained by sufficiently stir-blending: 100 parts of a solution obtained by diluting each polymer solution with DMDG in a concentration of 10%; 10 parts of trimethylolpropane triacrylate as a radically polymerizable compound; 0.9 part of benzophenone, 0.02 part of p,p'-diethylaminobenzophenone, and 0.08 part of 2,2-bis(o-chlorophenyl)-4,5,4',5'-tetraphenyl-1,2-biimidazole as photo-initiators. The following property tests were carried out by use of the photosensitive resin composition as obtained. The results were listed in Table 4.

(Development:)

The photosensitive resin composition was applied onto a glass substrate having 5 cm square by spin coating method, and thereafter dried at 100° C. for five minutes to form a uniform coating film having a thickness of 2 μm. This coating film was covered with a photomask having a determined pattern, and ultraviolet-irradiated with a super high-pressure mercury-vapor lamp in order to cure the coating film while the luminous energy was changed to 50, 100, and 200 mJ/cm², respectively. Next, the development was carried out using an aqueous potassium hydroxide solution of 0.1% at 25° C. as a developer in order to form a line-and-space having a width of 20 μm. After the development, the coating film was washed with pure water. Thereafter, the resultant coating film was post-baked at 180° C. for forty minutes and the curing was completed, thus obtaining a sample. The following evaluations (1) to (4) were carried out as to the resultant sample.

(1) Sensitivity of Exposure

The minimum luminous energy (mJ/cm²) for forming a good pattern is:

⊚:50, ○:100, Δ:200

(2) Pattern Shape

As to the sample as developed by exposing to light at a luminous energy of 200 mJ/cm², ⊚: there is no defect in an exposed portion and no dull corner.

○: there is very partially a defect in an exposed portion and a dull corner.

Δ: the sample was developed like line-and-space, but its corner is slightly dull as a whole.

(3) Surface Contamination

As to the sample as developed by exposing to light at a luminous energy of 200 mJ/cm², ⊚: there is no residual developed portion in an unexposed portion.

○: there is slightly a residual developed portion in an unexposed portion.

Δ: there is partially a residual developed portion in an unexposed portion.

X: there is a conspicuous residual developed portion in an unexposed portion.

(4) Development Time

When developing the sample as exposed to light at a luminous energy of 200 mJ/cm², ⊚: the development can be carried out within not longer than 20 seconds.

○: the development can be carried out within not longer than 40 seconds.

Δ: the development can be carried out within not longer than 60 seconds.

(Heat-Resistant Transparency:)

The photosensitive resin composition was applied onto a glass substrate by spin coating method, and thereafter dried at 100° C. for five minutes to form a uniform coating film having a thickness of 2 μm. This coating film was not covered with a photomask, and was ultraviolet-irradiated with a super high-pressure mercury-vapor lamp at a luminous energy of 200 mJ/cm² in order to cure the coating film. Next, the resultant coating film was post-baked at 180° C. for forty minutes and the curing was completed, thus obtaining a sample. The state after carrying out a heating test which involves heating the resultant sample at 250° C. for one hour was observed with eye, and was evaluated according to the following standard:

⊚:colorless and transparent, ○: slightly yellow, Δ: yellow, X: deep yellow.

(Heat-Resistant Film Decreasing Property:)

The surface roughness of the sample as obtained in the same way as of the evaluation of the heat-resistant transparency was measured with a surface roughness meter, and the heating test, which involved heating out for one hour at 250° C., was carried. Thereafter, the surface roughness was measured again with the surface roughness meter. The property was evaluated by the state before and after the heating test according to the following standard:

⊚: the state after heating is hardly different from that before.

◯: the state after heating is slightly rougher than that before, but is even.

Δ: the state after heating is even as a whole, but rough portions is conspicuous.

X: the state is rough after heating.

(Fracture Strength:)

The photosensitive resin composition was applied onto a glass substrate by spin coating method, and thereafter dried at 100° C. for five minutes to form a uniform coating film having a thickness of 5 μm. This coating film was covered with a photomask having a determined pattern, and ultraviolet-irradiated with a super high-pressure mercury-vapor lamp at a luminous energy of 200 mJ/cm$^2$ in order to cure the coating film. Next, the development was carried out using an aqueous potassium hydroxide solution of 0.1% at 25° C. as a developer in order to form a pillar spacer having a cross section of 15 μm square and a height of 5 μm. After the development, the spacer was washed with pure water. Thereafter, the resultant spacer was post-baked at 180° C. for forty minutes and the curing was completed, thus obtaining a sample. As to the sample as obtained, a load was measured when the pillar spacer was fractured with a micro compression test machine under room temperature, and the fracture strength was evaluated from the load value (gf) when the spacer was fractured according to the following standard:

⊚: not less than 15, ◯: 10 to 15 (except for 15), Δ: 5 to 10 (except for 10), X: less than 5.

(Adhesion:)

The photosensitive resin composition was applied onto a glass substrate by spin coating method, and thereafter dried at 100° C. for five minutes to form a uniform coating film having a thickness of 2 μm. This coating film was not covered with a photomask having a determined pattern, and was ultraviolet-irradiated with a super high-pressure mercury-vapor lamp at a luminous energy of 100 mJ/cm$^2$ in order to cure the coating film. Next, the resultant coating film was post-baked at 180° C. for forty minutes and the curing was completed, thus obtaining a sample. As to the sample as obtained, the adhesion was measured according to the chackerboad squares test method (JIS K5400), and the adhesion was evaluated by marking points according to the method for marking as described in JIS K5400. Then, the adhesion was evaluated according to the following standard:

⊚: not less than 9 points, ◯: 7 to 9 points (except for 9 points), Δ: 5 to 7 points (except for 7 points), X: less than 5 points.

EXAMPLE 3-1

A black photosensitive resin composition, a red photosensitive resin composition, a green photosensitive resin composition, and a blue photosensitive resin composition were produced respectively by adding the following components to 100 parts of the photosensitive resin composition as obtained in Example 2-2: 5 parts of a black pigment and 0.5 part of a surfactant; 5 parts of a red pigment and 0.5 part of a surfactant; 5 parts of a green pigment and 0.5 part of a surfactant; and 5 parts of a blue pigment and 0.5 part of a surfactant, respectively.

The black photosensitive resin composition was applied onto a well-washed glass substrate not containing alkali glass by spin coating method, and thereafter dried at 100° C. for five minutes to form a uniform coating film having a thickness of 0.5 μm. This coating film was covered with a photomask having a black matrix shape, and irradiated with a super high-pressure mercury-vapor lamp at a luminous energy of 500 mJ/cm$^2$ in order to cure the coating film. Thereafter, the development was carried out using an aqueous potassium hydroxide solution of 0.1% at 30° C. and the coating film was washed with pure water. Thereafter, the resultant coating film was post-baked at 210° C. for thirty minutes to form a black matrix. When the resultant black matrix was observed with an optical microscope, it had no defect and a good shape, and the surface contamination was not observed in an unexposed portion.

Furthermore, the red photosensitive resin composition was applied thereto by spin coating method, and thereafter dried at 100° C. for five minutes to form a uniform coating film having a thickness of 2 μm. This coating film was covered with a determined photomask, and irradiated with a super high-pressure mercury-vapor lamp at a luminous energy of 300 mJ/cm$^2$ in order to cure the coating film. Thereafter, the development was carried out using an aqueous potassium hydroxide solution of 0.1% at 30° C. and the coating film was washed with pure water. Thereafter, the resultant coating film was post-baked at 210° C. for thirty minutes to form a red picture element. Continuously, a green picture element and a blue picture element were formed by the same procedure with using the green photosensitive resin composition and the blue photosensitive resin composition, respectively. When the resultant picture element was observed with an optical microscope, no defect was observed in the picture element, and it had a good shape, and

TABLE 4

| | | Polymer solution as used | | | | | | | | | | |
|---|---|---|---|---|---|---|---|---|---|---|---|---|
| Properties as evaluated | | Example 1-1 | Example 1-2 | Example 1-3 | Example 1-4 | Example 1-5 | Example 1-6 | Example 1-7 | Example 1-8 | Example 1-9 | Example 1-10 | Comparative Example 1-1 |
| Development | Sensitivity of exposure | ◯ | ◯ | ◯ | ◯ | ◯ | ◯ | ◯ | ⊚ | ⊚ | ◯ | ◯ |
| | Pattern shape | ◯ | ◯ | ◯ | ◯ | Δ | ◯ | Δ | ⊚ | ⊚ | ◯ | Δ |
| | Surface contamination | ⊚ | ◯ | ◯ | ◯ | Δ | ◯ | ◯ | ⊚ | ⊚ | ◯ | X |
| | Development time | ⊚ | ◯ | ◯ | ◯ | Δ | ◯ | ◯ | ⊚ | ⊚ | ⊚ | ⊚ |
| Heat-resistant transparency | | ⊚ | ⊚ | ⊚ | ◯ | ◯ | ◯ | ◯ | ⊚ | ⊚ | ◯ | X |
| Heat-resistant film decreasing property | | ◯ | ◯ | ◯ | ◯ | ◯ | ◯ | ◯ | ⊚ | ⊚ | ◯ | X |
| Fracture strength | | ◯ | ◯ | ◯ | ◯ | ◯ | ◯ | ◯ | ⊚ | ⊚ | ⊚ | X |
| Adhesion | | ⊚ | ⊚ | ⊚ | ⊚ | ⊚ | ⊚ | ⊚ | ⊚ | ⊚ | ⊚ | Δ | the surface contamination was not observed, and the surface evenness was good.

Furthermore, the photosensitive resin composition as obtained in Example 2-2 was applied thereto by spin coating method, and thereafter dried at 100° C. for five minutes to form a uniform coating film having a thickness of 2 μm. This coating film was covered with a determined photomask, and irradiated with a super high-pressure mercury-vapor lamp at a luminous energy of 300 mJ/cm² in order to cure the coating film. Thereafter, the development was carried out using an aqueous potassium hydroxide solution of 0.1% at 30° C. and the coating film was washed with pure water. Thereafter, the resultant coating film was post-baked at 210° C. for thirty minutes to form a protecting film, and then a color filter was produced.

When one hundred color filters were produced by the above procedure, there were only two rejected articles that lost the picture element.

Next, a TFT liquid-crystal display was produced by a conventional method with using the resultant color filter. The resultant liquid-crystal display had good color purity, a vivid image, and high brilliancy.

EXAMPLE 3-2

A color filter was produced in the same way as of Example 3-1 except for using the photosensitive resin composition as obtained in Example 2-7.

Some defects were observed in both the black matrix and the picture element. However, the surface contamination was not observed, and the surface evenness was good.

In addition, when one hundred color filters were produced in the same way as of Example 3-1, there were four rejected articles that lost the picture element in a hundred.

Next, a TFT liquid-crystal display was produced by a conventional method with the resultant color filter. The resultant liquid-crystal display was slightly inferior in either color purity, vividness of image, or high brilliancy to that of Example 3-1, but it was favorable.

EXAMPLE 3-3

A color filter was produced in the same way as of Example 3-1 except for using the photosensitive resin composition as obtained in Example 2-9.

No defect and no surface contamination were observed in both the black matrix and the picture element, and the surface evenness was good.

In addition, when one hundred color filters were produced in the same way as of Example 3-1, there was no rejected article that lost the picture element.

Next, a TFT liquid-crystal display was produced by a conventional method with using the resultant color filter. The resultant liquid-crystal display had good color purity, a vivid image, and high brilliancy.

Comparative Example 3-1

A color filter was produced in the same way as of Example 3-1 except for using the photosensitive resin composition as obtained in Comparative Example 2-1.

Not only some defects and surface contamination were observed in both the black matrix and the picture element but also the surface was slightly rough.

In addition, when one hundred color filters were produced in the same way as of Example 3-1, there were seven rejected articles that lost the picture element in a hundred.

Next, a TFT liquid-crystal display was produced by a conventional method with using the resultant color filter. The resultant liquid-crystal display had bad color purity, a dull image, and low brilliancy.

Various details of the invention may be changed without departing from its spirit not its scope. Furthermore, the foregoing description of the preferred embodiments according to the present invention is provided for the purpose of illustration only, and not for the purpose of limiting the invention as defined by the appended claims and their equivalents.

What is claimed is:

1. A production process for a lactone-ring-containing polymer, wherein the polymer has a lactone ring structure formed by lactonization of a structural unit derived from a 2-(hydroxyalkyl)acrylate ester, with the production process comprising the steps of:
a) carrying out in a solution a solution polymerization of comonomers at 50 to 150° C., wherein the comonomers include an acidic-group-containing monomer together with the 2-(hydroxyalkyl)acrylate ester as essential monomer components;
b) optionally carrying out an aging reaction of said solution; and
c) carrying out a dehydration and dealcoholation of said solution with the step of carrying out solution polymerization.

2. A production process according to claim 1, which further comprises the step of carrying out an addition reaction of a compound to an acidic group of the resultant polymer after the polymerization, wherein the compound has a functional group and a radically polymerizable double bond, wherein the functional group is reactable with the acidic group.

3. A production process according to claim 1, wherein a residual amount of water and alcohol in said solution after said dehydration and dealcoholation is not more than 2 weight %.

4. A production process according to claim 1, wherein said production process includes said step of carrying out an aging reaction, and wherein said dehydration and dealcoholation is carried out after said step of carrying out an aging reaction.

5. A production process for a lactone-ring-containing polymer, wherein the polymer has a lactone ring structure formed by lactonization of a structural unit derived from a 2-(hydroxyalkyl)acrylate ester, with the production process comprising the steps of:
a) carrying out polymerization of comonomers at 50 to 150°, wherein the comonomers include an acidic-group-containing monomer together with the 2-(hydroxyalkyl)acrylate ester as essential monomer components; and
b) carrying out an addition reaction of a compound to an acidic group of the resultant polymer after the polymerization, wherein the compound has a functional group and a radically polymerizable double bond, wherein the functional group is reactable with the acidic group.

* * * * *